United States Patent [19]

Kapur et al.

[11] Patent Number: 6,064,808

[45] Date of Patent: May 16, 2000

[54] METHOD AND APPARATUS FOR DESIGNING INTERCONNECTIONS AND PASSIVE COMPONENTS IN INTEGRATED CIRCUITS AND EQUIVALENT STRUCTURES BY EFFICIENT PARAMETER EXTRACTION

[75] Inventors: Sharad Kapur, Hudson County; David Esley Long; Jingsong Zhao, both of Morris County, all of N.J.

[73] Assignee: Lucent Technologies Inc., Murray Hill, N.J.

[21] Appl. No.: 08/904,488

[22] Filed: Aug. 1, 1997

[51] Int. Cl.[7] .................................................... G06F 17/16
[52] U.S. Cl. ........................................... 395/500.23; 703/1
[58] Field of Search ........................... 395/500.23, 500.2, 395/500.04, 500.1; 703/14, 1

[56] References Cited

U.S. PATENT DOCUMENTS 5,664,158 9/1997 Larimer ..................................... 395/500
5,748,507 5/1998 Abatzoglou et al. ...................... 702/76

OTHER PUBLICATIONS

Collins, T. et al., "MaTRix+/sup+/: an object–oriented environment for parallel high–performance matrix computations," Proc. of 28th Hawaii Int'l Conf. on System Sciences, 1995, pp. 202–211.

Kapur et al., Fasthenry: A Multipole–Accelerated 3–D Inductance Extraction Program, IEEE: 42:9 (Sep. 1994), pp. 1750–1758.

Nabors et al., Preconditioned, Adaptive, Multipole–Accelerated Iterative Methods for Three–Dimensional First–Kind Integral Equations of Potential Theory, SIAM J. Sci. Comput., 15:3 (May 1994), pp. 713–735.

Rokhlin, Rapid Solution of Integral Equations of Classical Potential Theory, J. Comput. Phy., 60:187–207 (1983).

Beylkin et al., Fast Wavelet Transforms and Numerical Algorithms I, Commun. on Pure and Applied Mathematics, XLIV:141–183 (1991).

*Primary Examiner*—Eric W. Stamber
*Assistant Examiner*—Kyle J. Choi

[57] ABSTRACT

A component design tool extracts a parameter associated with a component defined in a model of a physical system. The design tool discretizes the component and generates a matrix representative of a specified parameter. By subdividing the matrix into a hierarchy of submatrices and iteratively compressing and blending the submatrices, the design tool produces a compressed matrix. The compressed matrix is efficiently solved using iterative techniques. From the solution of the matrix, the design tool calculates the specified parameter.

31 Claims, 10 Drawing Sheets

METHOD AND APPARATUS FOR DESIGNING INTERCONNECTIONS AND PASSIVE COMPONENTS IN INTEGRATED CIRCUITS AND EQUIVALENT STRUCTURES BY EFFICIENT PARAMETER EXTRACTION

FIELD OF THE INVENTION

Our invention relates to a method and apparatus for designing an electrical or mechanical system by extracting a parameter associated with a component of the system. More specifically, our invention relates to such a method and apparatus which extracts the parameter through the use of a matrix generated by a Method of Moments representation of a physical property associated with a force acting on the component, where the parameter may represent an aspect of a component or interconnection in a VLSI chip.

BACKGROUND OF THE INVENTION

Electronic integrated circuits are used in most modern electronic products. An integrated circuit consists of a large number of electronic circuits combined into a single package, commonly referred to as a "chip." Where these chips are relatively large they are referred to as very large scale integrated circuits ("VLSI"). Integrated circuits also may be combined to form multi-chip modules. A multi-chip module ("MCM") consists of several chips that are connected together by connection paths imbedded in the module.

The design of an integrated circuit involves defining the circuits to be included in the chip, designing the physical components within the chip that correspond to those circuits, providing signal paths to interconnect the components and designing passive circuit elements (such as inductors) that may be needed in the chip.

The characteristics of the passive components and the signal paths can have a significant impact on the operation of the chip. For example, the resistance, inductance and capacitance of these components will affect the signals that pass through them. Consequently, passive components in devices such as high-speed VLSI chips, printed circuit boards and multi-chip modules need to be accurately designed and analyzed to ensure that these devices will operate properly and reliably. Moreover, due to the relatively high cost of fabricating integrated circuits, these components should be rigorously characterized to ensure that the devices operate properly the first time they are fabricated.

Typically, the characteristics of the passive components depend on the attributes of the components. For example, the inductance of a signal path may depend on its width, shape and proximity to other components. Consequently, the process of calculating these characteristics, referred to in the art as parameter extraction, involves applying the appropriate mathematical algorithms to the attributes of the components.

There are two conventional methods of extracting parameters of passive components in integrated circuits. One method involves discretizing the region of interest on the component using either a finite difference scheme or a finite element scheme. Discretizing a region of interest involves subdividing the region into a set of contiguous sampling points. This method produces a system of linear equations which is solved to obtain the corresponding parameter.

The other method uses an integral equation formulation of the problem. Integral equation formulations have several advantages over the other method. For example, integral equation methods can often treat arbitrary regions more effectively than the other method. In addition, integral equation methods generally have better conditioning. In other words, the resulting system of equations may be solved more efficiently because the solution to the system of equations converges more rapidly using this method than it does using the other method. Furthermore, the dimensionality of the resulting system of equations may be smaller because comparable accuracy can be obtained using fewer sampling points on the component. Conventionally, finite element methods discretize sample points throughout the volume of the component. In contrast, integral equation methods typically only discretize the surface of the component.

Integral equation algorithms using the Method of Moments have been effectively used in the extraction of passive elements in the modeling of integrated circuits and multi-chip module packaging. The Method of Moments technique is discussed in the article "Preconditioned, Adaptive, Multipole-Accelerated Iterative Methods for Three Dimensional First-Kind Integral Equations of Potential Theory", by K. Nabors, et al., *SIAM J. Sci. Comput.*, Vol. 15(3), pp 713–735, May, 1994; and in the article "Rapid Solution of Integral Equations of Scattering Theory in Two Dimensions", by V. Rokhlin, *Journal of Computational Physics*, 86(2), pp 414–439, February, 1990, both of which are incorporated herein by reference.

Parameter extraction using integral equation methods, such as the Method of Moments, typically involves solving a relatively dense system of linear equations. Conventionally, systems of equations are represented in matrix form. For example, EQUATION 1 illustrates a very simple system of equations that defines a 2-by-2 matrix. The values for $A_1$, $B_1$, $C_1$, $A_2$, $B_2$ and $C_2$ would be known. Solving the matrix involves calculating the values of the variables $x_1$ and $x_2$. Various techniques for solving matrices are well known in the linear systems art.

$$A_1 x_1 + B_1 x_2 = C_1 \qquad \text{EQUATION 1}$$
$$A_2 x_1 + B_2 x_2 = C_2$$

The size of the matrix generated by the integral equation methods depends on the number of sampling points defined by the discretization process. In some applications, matrices having a size on the order of 1000-by-1000 are common. Many conventional factorization methods cannot efficiently solve matrices of this size.

A number of algorithms have been developed for efficiently solving the dense matrices that may be generated by integral equation methods. For example, the particle simulation algorithms and the capacitance and inductance extraction algorithms are well known. These algorithms are treated in the articles: "A Fast Algorithm for Particle Simulations", by L. Greengard and V. Rokhlin, *Journal of Computational Physics*, 72(2), pp 325–348, December, 1987; "Fasthenry: A Multipole Accelerated 3-D Inductance Extraction Program", by M. Kamon, et al., *IEEE Transactions on Microwave Theory and Techniques*, Vol. 42(9), pp 1750–58, 1994; "Fast Capacitance Extraction of General Three-Dimensional Structures", by K. Nabors and J. White, *IEEE Transactions on Microwave Theory and Techniques*, 1992, all of which are incorporated herein by reference.

These algorithms reduce the computation time needed to solve a matrix by exploiting the special structure of the problem. Specifically, they combine interpolation of the function that defines the matrix elements with a divide-and-conquer strategy. The resulting algorithms take O(n) or O(n log n) time to solve, where n is the dimension of the matrix. In other words, the number of operations performed by these algorithms is proportional to n or "n times log(n)."

In general, the above algorithms are custom designed for specific integral equation kernels. For example, in the Greengard and Nabors articles discussed above, the matrix kernel is of the form $1|x-x'|$ which is the free-space Greens function for the Laplace equation. These matrix-implicit schemes generally are not applicable when the matrix kernel of the integral equation is either not available analytically or does not conform to a simple analytic form. Such situations are frequently encountered in Method of Moments solution techniques for electromagnetic simulation.

The inability of the matrix-implicit fast algorithms to adapt to an arbitrary integral equation kernel has been partially addressed by the matrix-explicit fast wavelet algorithms. Wavelets permit representation of a variety of functions and operators with relatively little redundancy. Through their ability to represent local, high-frequency information with localized basis elements, wavelets allow adaptation in a straightforward and consistent fashion. However, wavelet based schemes suffer from the disadvantage that the sparse representation of the matrix is extremely sensitive to the choice of basis functions. Moreover, the compression is often unsatisfactory. In some sense wavelets, as they are currently applied, are too-general and cannot fully exploit the local low-rank structure of the matrices that result from integral equation kernels associated with physical problems.

Consequently, a need exists for an improved method for designing components and interconnections by extracting parameters associated with these passive components and connections in integrated circuits and other structure in other physical systems. In particular, a need exists for a parameter extractor that can use arbitrary integral equation kernels and that can exploit the low-rank structure of the matrix.

SUMMARY OF THE INVENTION

In accordance with an aspect of our invention, a method and apparatus are used to create designs by extracting parameters associated with components of physical systems, such as electrical and mechanical systems. Using Method of Moments techniques, the method involves the steps of discretizing a component and generating a system of equations representative of a selected parameter. The matrix associated with the system of equations is compressed by dividing the matrix into submatrices and selectively compressing and merging the submatrices. The equations of the resulting compressed matrix are solved using an iterative technique and calculating the value of the selected parameter from the solution of the matrix. The extracted parameter is the used to establish one element of the system design.

To use the method, a designer creates a model of the physical system. The model defines the components and their attributes. Typically, the system designer will represent the component attributes by a series of numerical definitions or by data associated with a computer generated model or schematic. The parameters to be extracted depend, in turn, on the component attributes as defined by known mathematical relationships. Accordingly, as part of the design method these mathematical relationships are applied to the attribute data to calculate the associated parameters.

The Method of Moments technique involves dividing the component into contiguous subareas and defining the selected parameter by a system of equations associated with the subareas. The system of equations defines a matrix, the solution of which is used to calculate the value of the selected parameter.

The invention may be implemented with special purpose hardware or a programmed computer or microprocessor which forms a "design tool" useful for designing complex structures, such as VLSI chips. The design tool compresses the original matrix created by the Method of Moments using an iterative submatrix compression technique. To this end, the design tool divides the matrix into a hierarchy of submatrices. The first (highest) level in the hierarchy defines the entire matrix. The second level divides the matrix into four submatrices. The third level has sixteen smaller submatrices, and so forth.

Initially, the design tool compresses the smallest submatrices, i.e., those at the lowest level in the hierarchy. Then, the design tool moves up the hierarchy, one level at a time, to compress the submatrices at the higher levels of the hierarchy. A compressed submatrix at a higher level is formed by merging the four compressed submatrices from the adjacent lower level that are encompassed by that submatrix.

For each submatrix at a level above the lowest level, the design tool either stores the corresponding compressed submatrix or it stores the four compressed submatrices from the next lowest level that are encompassed by the submatrix. The decision as to which submatrices are stored is based on the relative efficiency of multiplying a vector with the compressed submatrices. The above submatrix compression technique is repeated until the highest level of the hierarchy is reached. At this point, the entire matrix will be compressed.

The matrix solving technique involves multiplying the matrix with an estimated solution of the matrix to produce another estimated solution. This process is repeated until the estimated solution converges to a value that is within a specified tolerance of the actual solution of the matrix.

Through the use of the above techniques, the design tool can dramatically compress the original matrix. This greatly improves the speed with which the matrix can be iteratively solved. The preprocessing cost associated with generating the compressed matrix is amortized over the number of iterations employed by the iterative method. As a result, the preprocessing cost typically is relatively negligible.

Our design tool can be used to design practically any physical system that involves forces that decay smoothly with distance. This includes systems that involve electric or fluid potential forces. Thus, our design tool may be used to calculate inductance or capacitance in passive components embedded in integrated circuits. Also, our design tool may be used to calculate fluid densities and forces in a fluid-based system. In sum, our design tool attains an efficient and cost-effective method of extracting parameters associated with components of physical systems.

BRIEF DESCRIPTION OF THE DRAWINGS

These and other features of the invention will become apparent from the following description and claims, when taken with the accompanying drawings, wherein similar reference characters refer to similar elements throughout and in which:

DESCRIPTION OF THE ILLUSTRATIVE EMBODIMENT

Before describing the illustrative embodiments of design tools in accordance with our invention, it will facilitate an understanding of our invention to explain the methods utilized by the design tools.

Figure 1:
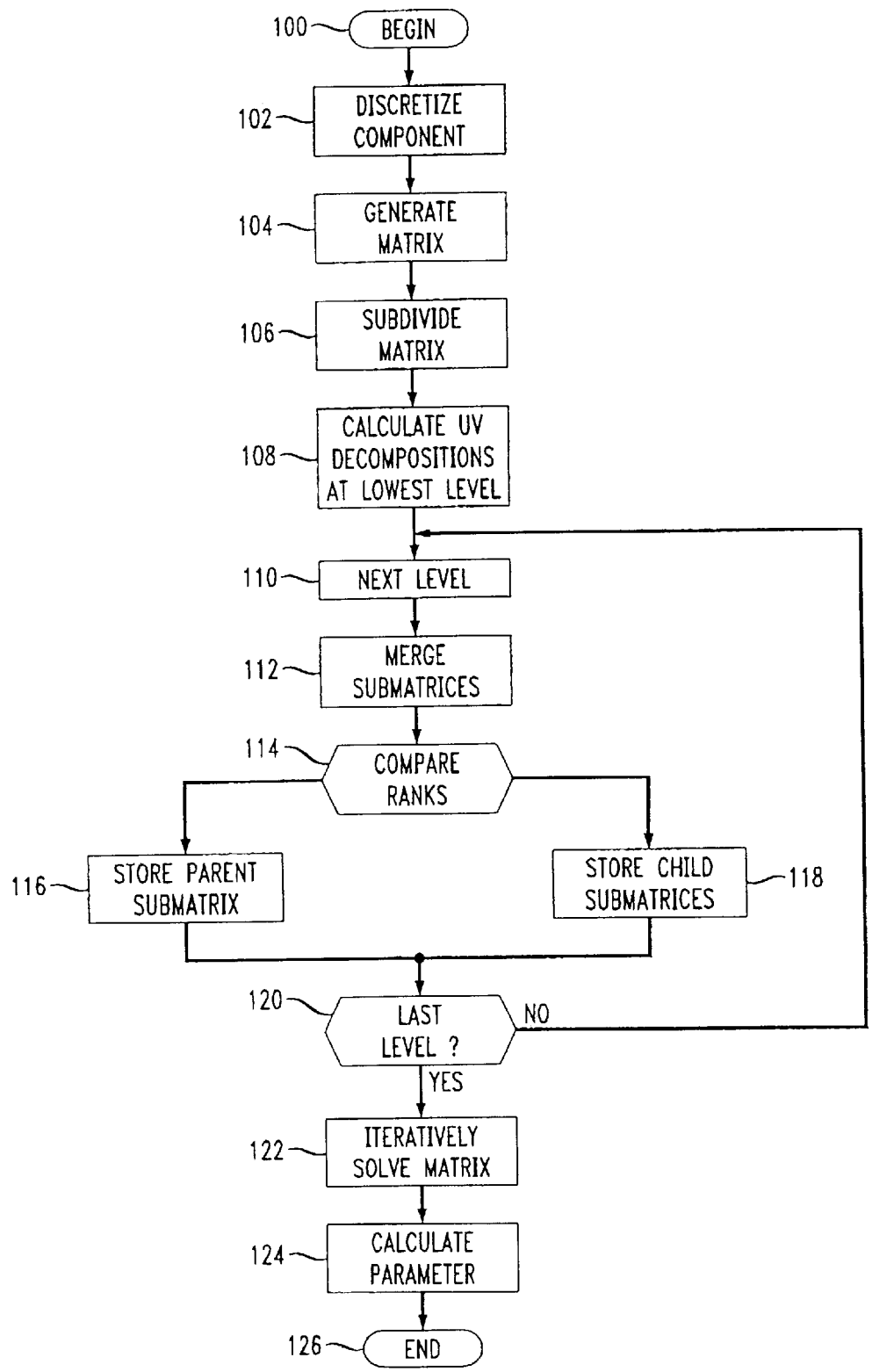
FIG. 1 is a flowchart of a parameter extraction method utilized by a design tool according to our invention.

Referring to FIG. 1, a method by which our design tool extracts parameters from a model of a physical system is preliminarily considered beginning at block 100. This flow chart and the ones that follow also illustrate components of a program for a computer implementation of our design tool.

In FIG. 1 the method discretizes a component of the model and generates a matrix that is compressed and iteratively solved to provide a specified parameter. At blocks 102 and 104, the method generates the matrix representation of the system of equations that define the specified parameter of the component. At block 102, the component is discretized by defining contiguous subareas throughout the component. For each subarea, the portion of the specified parameter that is attributable to the subarea is defined by the appropriate equation. These equations are solved to generate the coefficients of the matrix (block 104).

Figure 2:
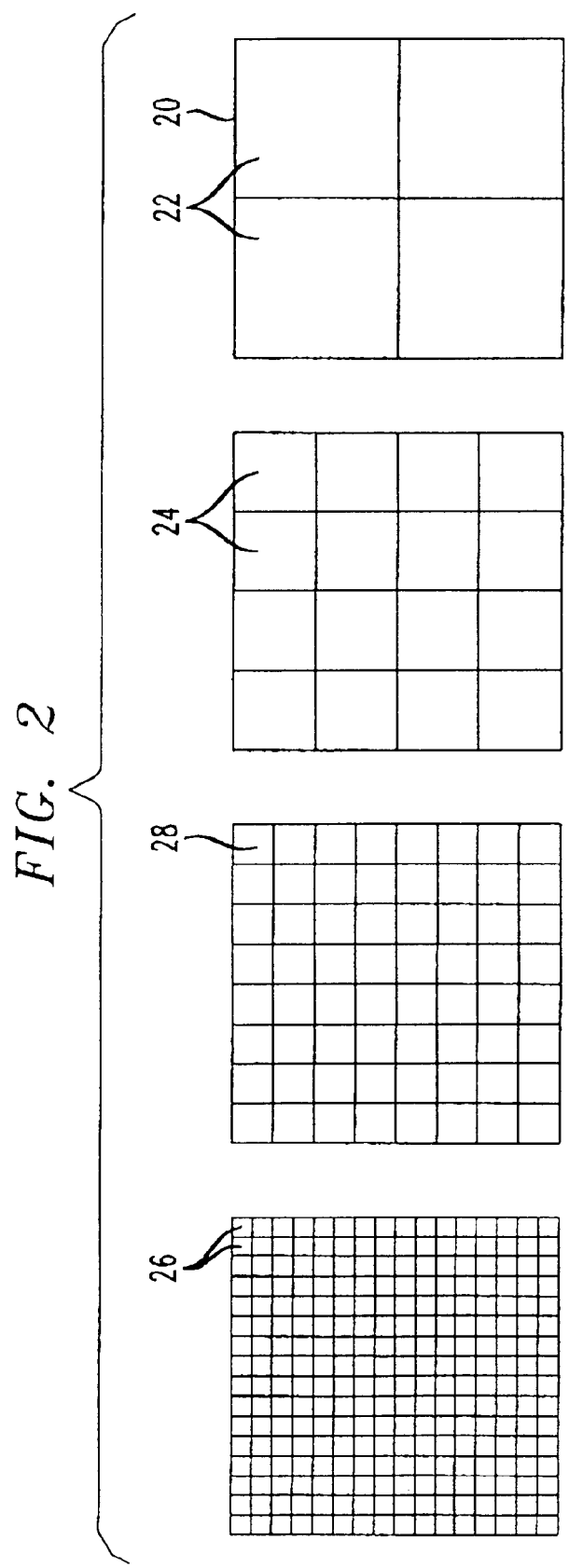
FIG. 2 is a graphic representation of a hierarchy of submatrices as treated herein.

At blocks 106 through 120, the method compresses the matrix using an iterative submatrix compression scheme. At block 106 the matrix is subdivided into a hierarchy of submatrices. FIG. 2 illustrates the submatrix hierarchy. The original matrix 20 is divided into four submatrices (e.g., submatrices 22). Each of these submatrices is subdivided into four submatrices (e.g., submatrices 24). The designer defines successive levels of submatrices in a similar manner to obtain the desired level of refinement.

At block 108, each of the submatrices (e.g., submatrices 26) at the finest level of refinement is compressed. In a preferred embodiment, this is accomplished by generating the UV decomposition of each submatrix. UV decomposition techniques are treated in detail later in this specification.

Beginning at block 110 of FIG. 1, the submatrices at the next level of refinement are compressed. For example, in FIG. 2, the submatrix 28 is compressed at this step. Consistent with traditional hierarchy nomenclature, the submatrix 28 is referred to as the parent of the four submatrices (e.g., submatrices 26) at the previous level that are encompassed by it. Conversely, these four submatrices are referred to as the child submatrices of the parent submatrix.

Figure 3:
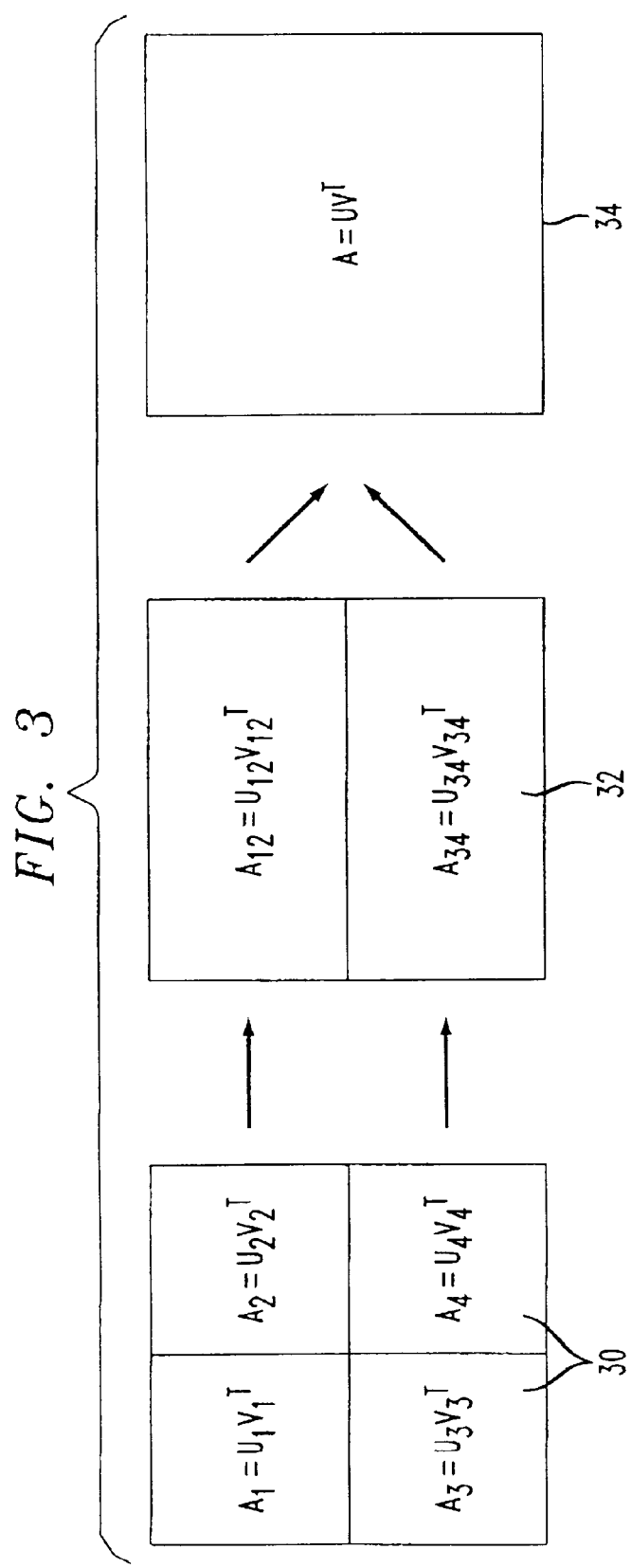
FIG. 3 is a graphic representation of a submatrix blending operation in accordance with the present invention.

The method generates a compressed submatrix at levels other than the finest level of refinement by merging the four child submatrices (block 112). As depicted in FIG. 3, two pairs of child submatrices (e.g., submatrices 30) are merged to form two new submatrices (e.g., submatrix 32). The two new submatrices are merged to form the parent submatrix 34.

At block 114 of FIG. 1, the method compares the ranks of the submatrices to determine whether to store the compressed parent submatrix or the four compressed child submatrices. This decision is based on the relative efficiency of solving the matrix using the corresponding submatrices. If the rank comparison dictates that it will be more efficient to use the parent submatrix, the method stores this submatrix (block 116). If the child submatrices should be stored instead, the method proceeds to block 118.

At block 120, the method tests whether it is processing the last level of the hierarchy. In other words, if the current submatrix is the entire matrix, the entire matrix has been compressed and the method proceeds to block 122. Otherwise the method returns to block 110 and the steps set forth above are repeated for the higher levels in the hierarchy.

At block 122, the method solves the matrix using an iterative technique. The solution to the matrix is processed to derive the value of the specified parameter (block 124) and the method terminates at block 126.

With the above description in mind, the method of FIG. 1 will now be treated in detail as it is used in the modeling of an embedded inductor in a multi-chip module. Passive components such as lumped inductors are important components of multi-chip modules for wireless communication systems and other radio frequency applications. These integrated inductors must be properly designed and characterized to ensure that the module will operate properly.

Figure 4A:
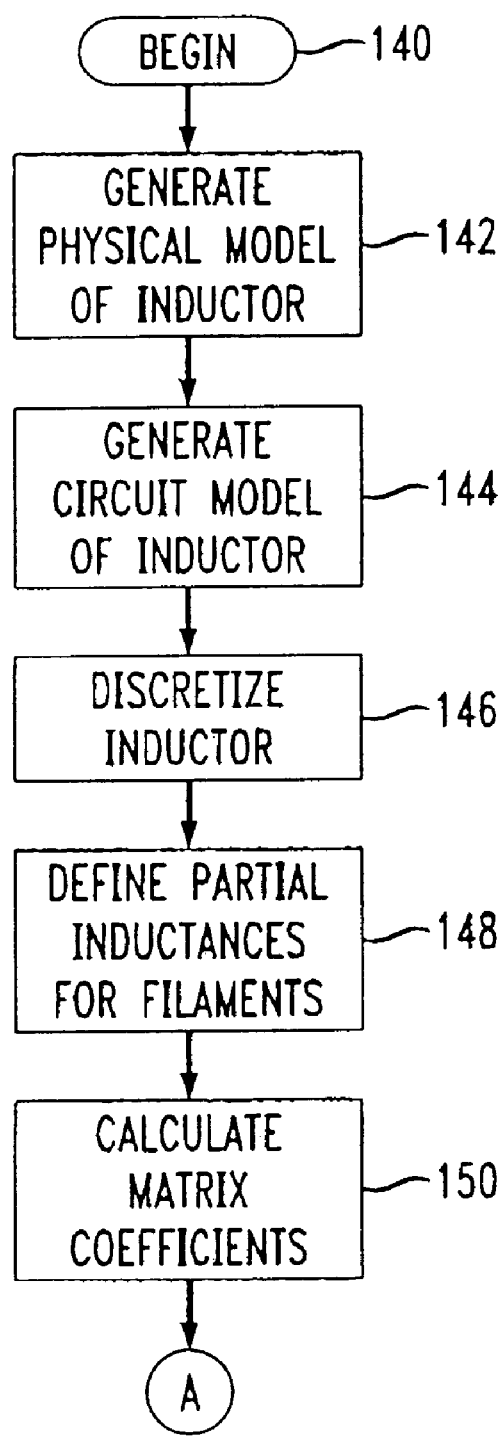
FIGS. 4A and 4B are a flowchart of a matrix generating, compressing and solving method according to the present invention.
Figure 4B:
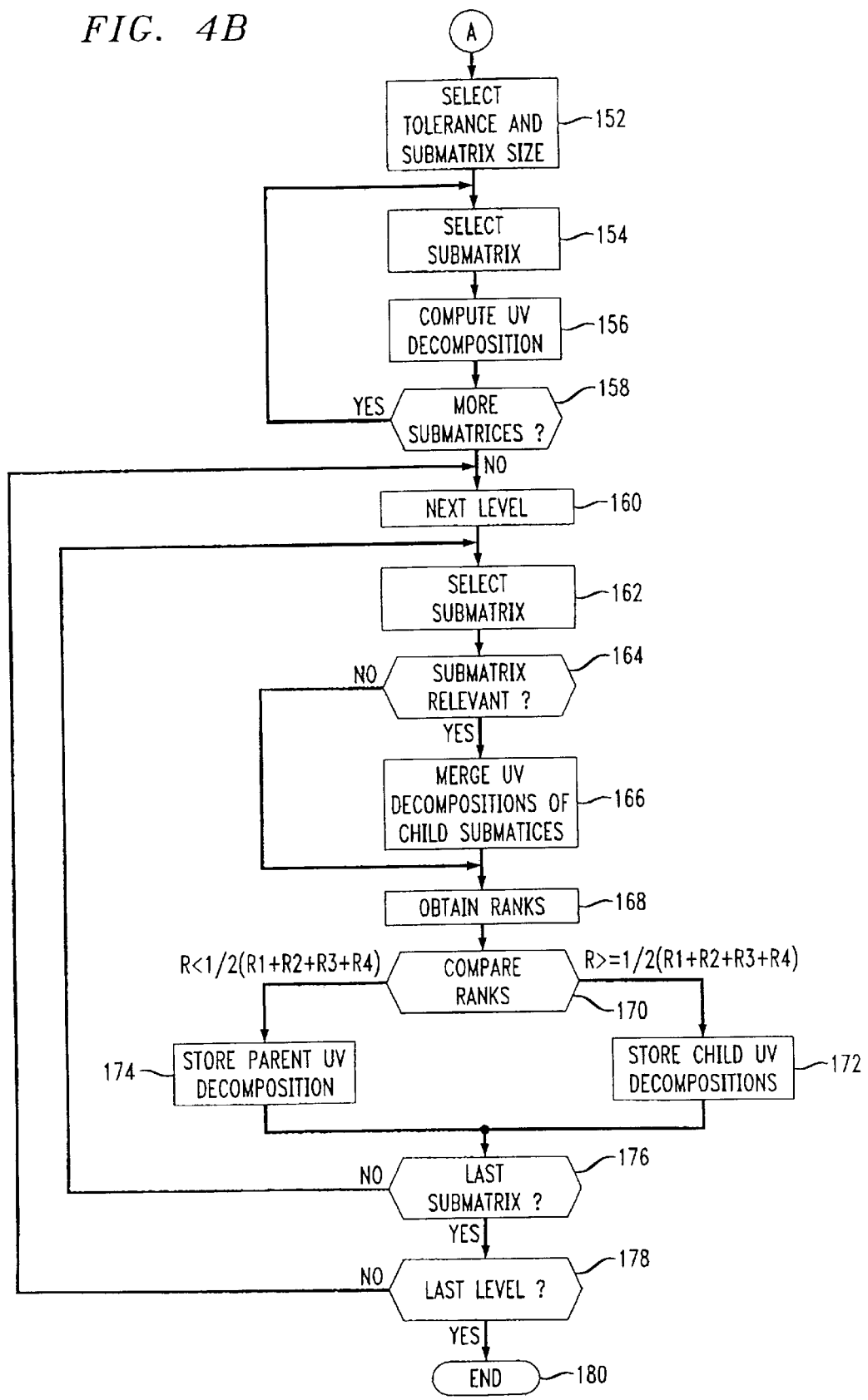

The modeling procedure is treated in FIGS. 4A and 4B and involves the following operations. Initially, the multi-chip module designer creates the physical structure and the equivalent circuit of the inductor. Next, the Method of Moments technique is used to generate a system of equations representative of the inductor circuit. The method then solves the system of equations, as represented in matrix form, as discussed above. The solution of the matrix is used to calculate the inductance of the inductor and other design parameters.

Figure 5A:
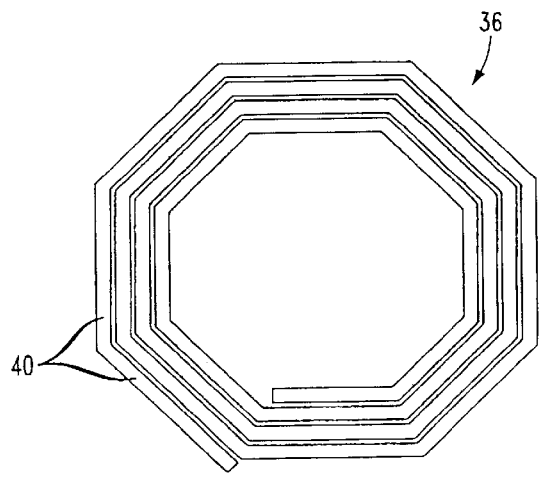
FIGS. 5A and 5B are graphic representations of a physical structure and an equivalent circuit model of an inductor as treated herein.

In FIG. 4A beginning at block 140, a multi-chip module designer creates the inductor model using a computer-aided design (CAD) system (block 142). Using the computer-aided design system, the designer specifies the physical attributes of the inductor including its size and the width and thickness of the metal wire defining the inductor. FIG. 5A depicts the physical structure of a typical octagonal inductor 36.

Figure 5B:
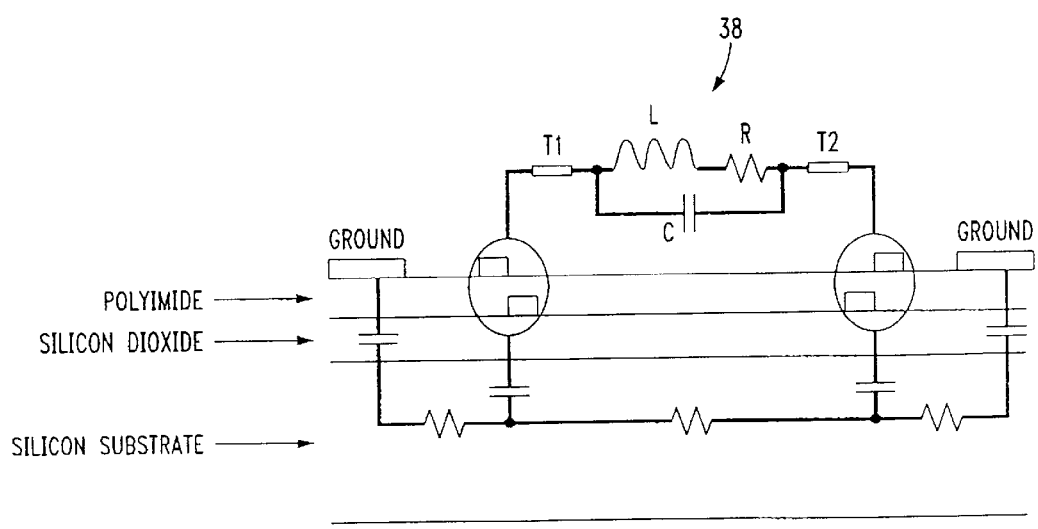

At block 144, the designer creates the equivalent circuit model of the inductor in the CAD system. In this example, the quasi-lumped model 38 depicted in FIG. 5B is used to represent the inductor 36 of FIG. 5A. In general, the form of the equivalent circuit depends on the physical structure being modeled. The details of the design of passive components and related equivalent circuits are well known in the integrated circuit art. Accordingly, this portion of the design process will not be discussed further.

Figure 6:
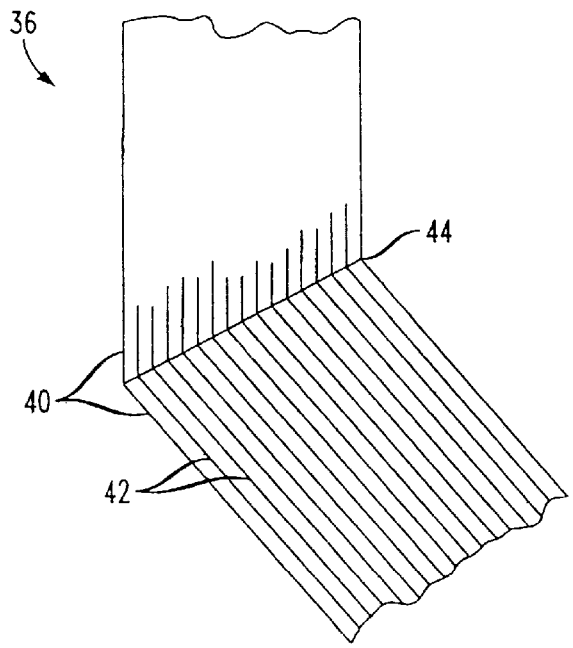
FIG. 6 is a fragmented view of a graphic representation of a discretized component as treated herein.

Blocks 146–150 treat the Method of Moments formulation of the inductor matrix. At block 146, the method discretizes the inductor of FIG. 5A. As illustrated in FIG. 6, each section 40 of the metal wire is split into several parallel strips, referred to as filaments 42. As is typical in integral equation formulations, an increase in the discretization of the component will result in a more accurate value being extracted for the component. However, there will be a corresponding decrease in the performance of the design tool because there are more equations. Nevertheless, an acceptable balance between accuracy and matrix solving speed often can be achieved because the accuracy obtained at increased levels of discretization is subject to diminishing returns.

At block 148, the method defines the partial inductances for the discretized inductor. Each filament 36 is assumed to have the same direction of current flow. Current in the direction perpendicular to the wire is ignored. The problem can be simplified in this manner because the contribution of such parasitic current to the total electrical performance is negligible for the frequency range of interest.

The following boundary conditions are imposed: At the nodes at which the filaments connect (e.g., node 44 of FIG. 6), the voltage is constrained to be the same (KVL); the sum of the currents in the strips of the same wire segment (e.g., segment 40) is a constant (KCL). These boundary conditions force the current to redistribute into edge effects rather than distribute uniformly (as in the DC case).

According to circuit theory:

$$V = (R + j\omega M) I \qquad \text{EQUATION 2}$$

where R is a diagonal matrix representing the self resistance for each filament, M is the partial inductance matrix, V is the branch voltage vector between the terminals of the filaments, and I is the branch current vector flowing through the filaments.

The partial inductance of the filaments can be defined as described in the article "Three-Dimensional Interconnect Analysis Using Partial Element Equivalent Circuits", by H. Heeb and Albert E. Ruehli, *IEEE Transactions on Circuits and Systems I: Fundamental Theory and Applications*, 39(11), pp 974–82, November, 1992, which is incorporated herein by reference. The mutual partial inductance between filaments i and j is:

$$M_{ij} = \frac{\mu_0}{2\pi} \int_{a_i} \int_{l_i} \int_{a_j} \int_{l_j} \frac{1}{|\vec{r}_i - \vec{r}_j|} da_i da_j d\vec{l}_i d\vec{l}_j \qquad \text{EQUATION 3}$$

The variables $a_i$ and $a_j$ are the cross sectional areas of filaments i and j, respectively. The variables $l_i$ and $l_j$ are line vectors of the currents. Each filament 42 represents a flat straight conductor of width w, length l, and zero thickness. Current distribution inside each filament is assumed to be uniform.

The formula for the partial self inductance of each filament as described in the article "CAD Models of Lumped Circuits on GaAs up to 18 GHz", by E. Pettenpaul, et al., *IEEE Transactions on Microwave Theory and Techniques*, 36(2), pp 294–304, February, 1988, is:

$$M_{ii} = \frac{\mu_0 l}{2\pi} \left\{ \operatorname{arcsinh}\left(\frac{l}{w}\right) + \frac{l}{w}\operatorname{arcsinh}\left(\frac{w}{l}\right) + \frac{w}{3l} - \frac{1}{3}\left(\frac{l}{w}\right)^2 \left[\left(1 + \frac{w^2}{l^2}\right)^{\frac{3}{2}} - 1\right] \right\} \qquad \text{EQUATION 4}$$

Assuming two parallel filaments (or strips) of width of w, length l, spacing s and zero thickness, the partial mutual inductance as given by the Pettenpaul article referenced above is:

$$M_{ij} = \frac{\mu_0 l}{4\pi}\left(\frac{l}{w}\right)^2 \left[ F\left(\frac{s}{l}\right) - F\left(\frac{w+s}{l}\right) + F\left(\frac{2w+s}{l}\right) - F\left(\frac{w+s}{l}\right) \right] \qquad \text{EQUATION 5}$$

where $$F(q) = q^2 \operatorname{arcsinh}\left(\frac{1}{q}\right) + q \operatorname{arcsinh}(q) + \frac{q^3}{3} - \frac{1}{3}(1+q^2)^{\frac{3}{2}} \qquad \text{EQUATION 6}$$

The coefficients of the matrix ($M_{ij}$, for i and j ranging from 0 through the size n of the matrix) are calculated from EQUATIONS 4, 5 and 6 (block 150). Perpendicular filaments have zero mutual inductance. For the mutual inductance between non-regular angles, the partial inductance integral is accurately computed by adaptive Gaussian integration. See, for example, the book *Numerical Recipes in C*, by W. Press, et al., Cambridge University Press, 1992. To calculate the current distribution, the method operates under the assumption that a unit current source excites one port and that this current will flow through the inductor without any time delay. This assumption is acceptable because the inductor is much smaller than the wavelength of the frequency of interest and thus behaves like a lumped circuit. Since all the filaments within a segment have the same voltage drop across them:

$$(R' + j\omega M')_{ij} = (R + j\omega M)_{ij} - (R + j\omega M)_{i+1,j} \qquad \text{EQUATION 7}$$

where ω is the angular frequency. The sum of the currents in each segment is 1.

$$(R' + j\omega M')_{ij} = \begin{cases} 1 & \text{if } i \text{ is in this segment} \\ 0 & \text{otherwise} \end{cases} \qquad \text{EQUATION 8}$$

This is equivalent to the following linear system.

$$(R' + j\omega M') I = B \qquad \text{EQUATION 9}$$

where I is the current vector and:

$$B_i = \begin{cases} 1 & \text{if } i \text{ is in this segment} \\ 0 & \text{otherwise} \end{cases} \qquad \text{EQUATION 10}$$

The solution of the system of equations in EQUATION 9 gives the branch currents. The equivalent inductance and resistance of the inductor are extracted from the branch currents.

Discretization of an integral equation by the moment method results in a dense system of linear algebraic equations. However, these systems almost always have an asymptotically bounded condition number. Hence, iterative schemes may be employed to obtain the solution. Iterative solving of integral equations involves the application of the integral operator matrix to a sequence of recursively generated right-hand side vectors. Applying a matrix to a vector is, generally speaking, an $O(n^2)$ procedure where n is the number of nodes in the discretization. The processing time for such an operation can often prove to be prohibitive, especially if the number of iterations (or right-hand sides) is large.

Described herein is a method for numerically applying Method of Moment matrices to arbitrary vectors in a relatively fast manner. This method combines a Krylov-subspace iterative algorithm and a singular value decomposition-based procedure. Taking into account that large sections of Method of Moment matrices are numerically low rank, the singular value decomposition-based procedure is used to compress rank deficient matrices.

Singular value decomposition methods are based on the theorem that any N×N matrix A can be written as a product of an N×N orthogonal matrix U, an N×N diagonal matrix S with positive or zero elements (the singular values) and the transpose of an N×N orthogonal matrix V:

$$A = U \cdot S \cdot V^T \qquad \text{EQUATION 11}$$

where $$U \cdot U^T = V \cdot V^T = I \qquad \text{EQUATION 12}$$

where I is the N×N identity matrix.

When the singular values $S = \text{diag}(s_1, s_2, \ldots, s_N)$ are sorted, largest to smallest, the decomposition is unique. The numerical rank of a matrix to a precision $\epsilon$ is defined as the integer r such that $S_r/S_l < \epsilon$. An N×N matrix A of rank r can be approximated as a sum of outer products of U and the rows of $V^T$, with the weighing factors being the singular values $S_k$, $$\tilde{A}_{i,j} = \sum_{k=1}^{r} s_k U_{ik} V_{jk} \qquad \text{EQUATION 13}$$

such that $$\|A - \tilde{A}\|_2 < \epsilon \qquad \text{EQUATION 14}$$

A rank deficient matrix is defined as a matrix with a rank that is much smaller than its dimensionality (r<<N). As discussed above, a rank-deficient matrix may be approximated with a few columns of U and V. Given the singular value decomposition of a rank deficient matrix, it is very efficient to multiply such an approximated matrix with a vector x. This involves taking the dot product of z with each of the stored columns of V. The resulting scalar is multiplied by the corresponding singular value $S_k$. The final step involves accumulating that multiple of the corresponding column of U. Thus, a matrix A of rank r can be multiplied by a vector in 2Nr operations instead of $N^2$ operations.

Figure 7:
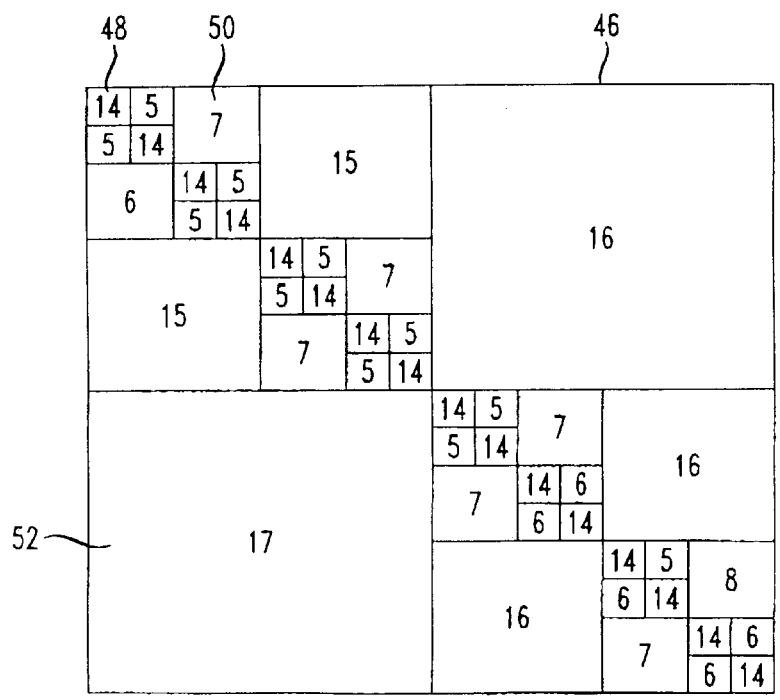
FIG. 7 is a graphic representation of a rank map of a compressed matrix in accordance with the present invention.

The method disclosed herein compresses a Method of Moment matrix in a similar manner. Although an integral operator matrix arising from the Method of Moments is not low rank, it can be partitioned into submatrices, each of low rank. For example, FIG. 7 depicts a typical inductance matrix 46 arising from a Method of Moments discretization of an integral equation. The submatrices (e.g., submatrix 48) on the diagonal are of size k×k, those removed (e.g., submatrix 50) are 2k×2k and so forth up to the largest submatrices (e.g., submatrix 52), of size n/2×n/2. The total number of submatrices is proportional to n/k.

With the above in mind, a method for the rapid multiplication of a Method of Moments matrix by a vector as utilized in our invention follows. The method uses a hierarchy of grids to subdivide the matrix into progressively finer partitions (see FIG. 2). The algorithm has two stages. The first stage adaptively preprocesses the matrix by constructing the appropriate UV decompositions of the submatrices in a bottom-up manner, first computing the UV decomposition of the "leaves" of the hierarchy "tree."

The method generates the UV decompositions for parent submatrices by merging the orthogonal decompositions of the child submatrices. At each step, the method determines whether to keep this merged form. This procedure is repeated until the coarsest level of subdivision is reached. The resulting structure, which represents a sparse form of the matrix, is stored in a memory. The processing required for this stage is proportional to the number of elements in the original matrix or the "write-down" time of the matrix.

The second stage efficiently applies this sparse representation of the matrix to a vector. The product of the vector and the entire matrix is computed by applying the singular value decomposition-based matrix-vector multiplication procedure to each low rank submatrix and by multiplying the full rank blocks (in this case, the diagonal) directly. This stage uses an iterative scheme (conjugate gradient for a symmetric positive definite matrix and a conjugate residual style algorithm like GMRES for a non-symmetric matrix) to solve the sparse matrix. The processing required for this stage is proportional to the number of sparse elements.

FIG. 4B describes this method in detail. At block 152, the multi-chip module designer selects the tolerance E for the matrix compression algorithm and the dimension $k_{base}$ of the sub-matrix at the finest level of refinement. The values of these variables determine the accuracy with which the matrix is solved. Small values for $\epsilon$ and $k_{base}$ result in a more accurate solution to the matrix. However, it will take the matrix solving portion of the system a longer period of time to calculate a more accurate solution.

At block 154, the method selects one of the submatrices (e.g., submatrix 26, FIG. 2) at the finest level of refinement. The submatrix is compressed at block 156. In a preferred embodiment, the method uses the pivoted Gram-Schmidt algorithm to compress the matrix. In practice, it is more efficient to use the pivoted Gram-Schmidt algorithm rather than the singular value decomposition technique discussed above. The text entitled *Introduction to Numerical Analysis*, by J. Stoer and R. Bulirsch, published by Springer-Verlag, New York, N.Y., 1979, describes a stable pivoted Gram-Schmidt algorithm based on reorthogonalization.

Given an M×N matrix A and a designer-specified tolerance $\epsilon$, the Gram-Schmidt procedure computes the numerical rank r and the M×r column-orthogonal matrix U which spans the column space of A. The algorithm takes O(MNr) operations.

The UV decomposition of an n×n matrix A of rank r is defined to be $A = UV^T$ where U and $V^T$ are both n×r matrices with one of them being orthogonal. The UV decomposition of a matrix A is constructed by first computing the N×r orthogonal matrix U which spans the column space of A by the pivoted Gram-Schmidt algorithm. Second, the projection of UT onto A is computed to obtain V. That is, $V^T = U^T A$ and $A = UV^T$. As with the singular value decomposition technique, given the UV decomposition of a rank deficient matrix, it is very efficient to multiply such an approximated matrix with a vector x. First, compute $z = V^T x$, then compute $y = Uz$. This process takes 2nr operations.

The above procedure is repeated for each of the submatrices at the lowest level in the submatrix hierarchy (blocks 154–158). When the UV decomposition has been computed for all of the submatrices at this level, the method proceeds to calculate the UV decompositions for the submatrices (e.g., submatrix 28, FIG. 2) at the next higher level in the submatrix hierarchy (block 160).

At block 162, the method selects a parent submatrix (e.g., submatrix 28) to be processed. At blocks 164 and 166, the method computes the UV decompositions of the submatrices. At block 164, the method determines whether the current submatrix is relevant. In other words, the method determines whether the submatrix has no child submatrices that will be multiplied at levels below the level of the child submatrices. As will be discussed later in this specification, the relevance of a submatrix depends on its rank. At block 166, the UV decomposition of the current submatrix is calculated as follows:

The UV decomposition of the parent submatrix is calculated by merging the UV decompositions of the four child submatrices associated with the parent submatrix. For example, assume that FIG. 3 represents a 2k×2k parent matrix A 34 of rank r partitioned into four k×k child submatrices $A_1$, $A_2$, $A_3$ and $A_4$ (e.g., submatrices 30) of ranks $r_1$, $r_2$, $r_3$ and $r_4$, respectively. Also assume that the UV decompositions of each of the children have been calculated: $A_i = U_i \cdot V_i^T$ where $V_i$ are orthogonal matrices for i=1, 2, 3 and 4. Then, EQUATION 15 efficiently computes the orthogonal UV decomposition of the parent matrix by merging the orthogonal UV decompositions of the child submatrices:

STEP 1. Horizontally merge $A_1$ and $A_2$.

Construct a k×($r_1+r_2$) matrix $X=[U_1 U_2]$. Use the pivoted Gram-Schmidt algorithm to obtain the orthogonal k×$r_{12}$ subspace matrix $U_{12}$ of X where $r_{12}$ is the rank of X. Compute the $r_{12}$×k matrix:

$$V_{12}^T = U_{12}^T \cdot [U_1 \cdot V_1^T U_2 \cdot V_2^T]$$

Now, $$[A_1 A_2] = U_{12} \cdot V_{12}^T = A_{12}$$

STEP 2. Horizontally merge $A_3$ and $A_4$.

Construct a k×($r_3+r_4$) matrix $Y=[U_3 U_4]$. Use the pivoted Gram-Schmidt algorithm to obtain the orthogonal k×$r_{34}$ subspace matrix $U_{34}$ of X where $r_{34}$ is the rank of Y. Compute the $r_{34}$×k matrix:

$$V_{34}^T = U_{34}^T \cdot [U_3 \cdot V_3^T U_4 \cdot V_4^T]$$

Now, $$[A_3 A_4] = U_{34} \cdot V_{34}^T = A_{34}$$

STEP 3. Vertically merge $A_{12}$ and $A_{34}$.

Construct a 2k×max($r_{12}+r_{34}$) matrix $Z=[V_{12}, V_{34}]$. Use the pivoted Gram-Schmidt algorithm to obtain the orthogonal 2k×r subspace matrix V of Z where r is the rank of Z. Compute the 2k×r matrix:

$$U = [U_{12} \cdot V_{12}^T, U_{34} \cdot V_{34}^T] \cdot V$$

Now, $$A = U \cdot V^T. \qquad \text{EQUATION 15}$$

Given a low rank 2k×2k matrix A, the direct use of the Gram-Schmidt algorithm to obtain the UV decomposition requires at least $O(k^2 r)$ operations. On the other hand, EQUATION 15 calculates the UV decomposition using $O(kr^2)$ operations, assuming that the submatrices are all of rank r. For rank deficient matrices (r<<k), the latter algorithm is far more efficient.

Next, the method determines whether it will be more efficient to multiply the parent UV decompositions or the child UV decompositions by a vector when it iteratively solves the matrix. Given a k×k parent matrix A of rank r partitioned into four k/2×k/2 child submatrices $A_1$, $A_2$, $A_3$ and $A_4$ of ranks $r_1$, $r_2$, $r_3$ and $r_4$, respectively, if $$r < \frac{1}{2}(r_1 + r_2 + r_3 + r_4) \qquad \text{EQUATION 16}$$

then it is more efficient to multiply A with a vector using the UV decomposition of the parent submatrix. Otherwise, it is more efficient to multiply A with a vector using the UV decompositions of the child submatrices. This follows from a comparison of the number of operations required for the respective processes. The matrix-vector product of A and x using the UV decomposition of the parent submatrix involves 2kr operations. The same matrix-vector product using the UV decompositions of the child submatrices involves $2((k/2 \cdot r_1)+(k/2 \cdot r_2)+(k/2 \cdot r_3)+(k/2 \cdot r_4))=k(r_1+r_2+r_3+r_4)$ operations.

At blocks 168 and 170, the method determines whether the submatrix is of high rank. If so, this submatrix will be multiplied with the vector during the iterative solving step. As discussed above in conjunction with EQUATION 16, the method compares the ranks of the current submatrix with the ranks of that submatrix's child submatrices. If it is more efficient to compute a matrix-vector product at the child submatrices' level, the relevant UV decompositions of the child submatrices are stored for use in the iterative multiplication step (block 172). Otherwise, the UV decomposition of the submatrix at the current level is stored for use in the computation at the next level (block 174).

This procedure is repeated for each submatrix at each level until the coarsest level of subdivision is reached (blocks 160–178). That is, all relevant submatrices will have been compressed when the size of the current submatrix is equal to the size of the entire matrix. The resulting structure represents a sparse form of the matrix. After the preprocessing step, the matrix is recursively partitioned into UV decompositions. This structure is recursively stored.

FIG. 7 depicts a rank map of a typical 256×256 inductance matrix after it has been compressed. The number within each submatrix represents its rank to a specified precision ε. The submatrix 52 illustrates the efficiencies that can be achieved using the present method. The original 128×128 submatrix has been reduced to a 128×17 submatrix.

Figure 8:
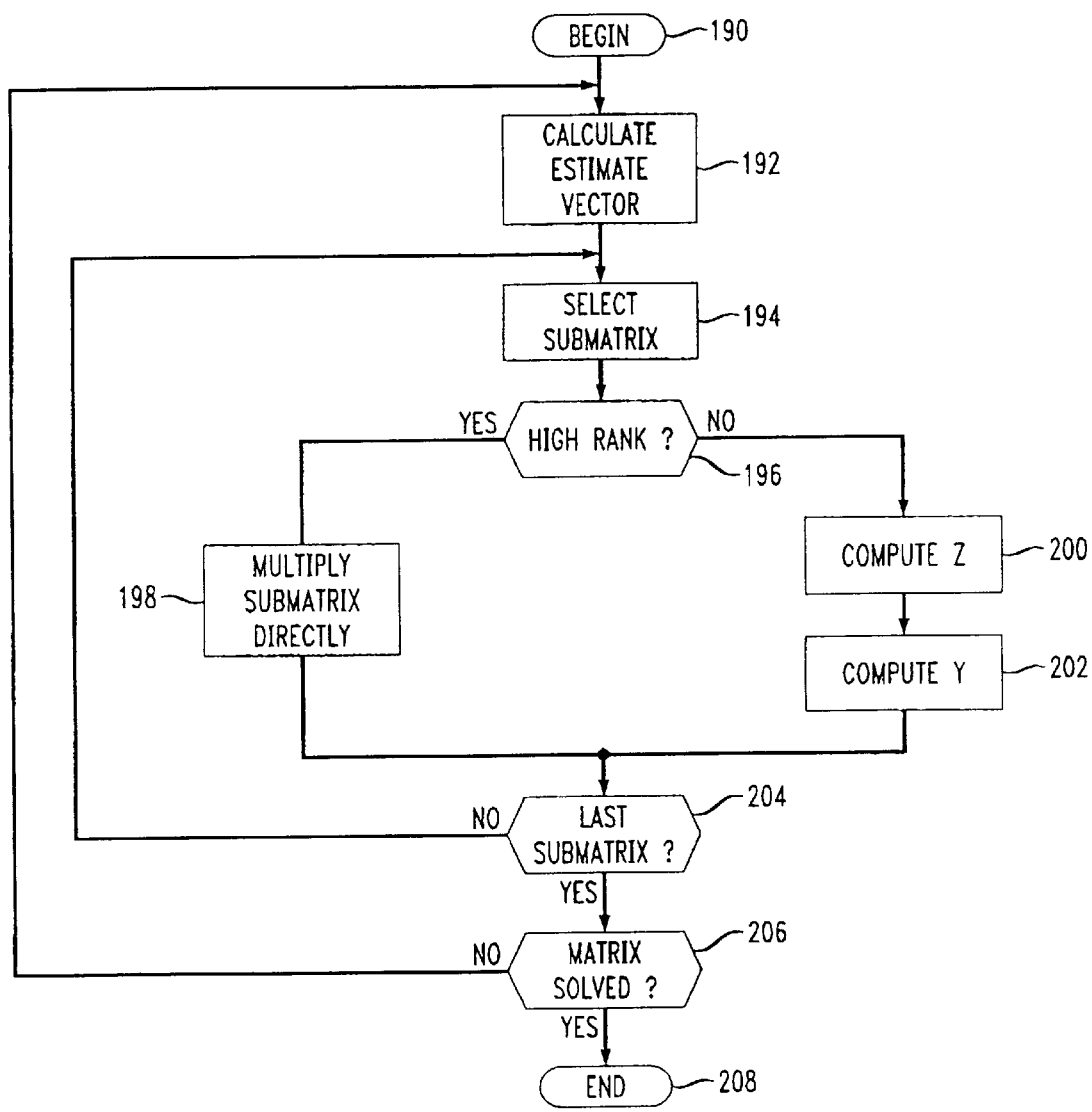
FIG. 8 is a flowchart of an iterative matrix solving method according to the present invention.

FIG. 8 describes an iterative method for solving the compressed matrix. At block 192, the method generates an estimated solution vector for the matrix. Matrix preconditioning techniques such as frequency-dependent preconditioning may be used to increase the efficiency of the matrix solving process.

Next, at all levels starting from the finest level, all the submatrices are multiplied by the vector. At block 194, the method selects a submatrix. At block 196, if the submatrix is of high rank, the method directly multiplies the submatrix with the vector (block 198).

If the submatrix is of low rank, the method multiplies the UV decomposition of the submatrix by the vector. As discussed above, the method multiples a vector x by the matrix by computing $z=V^T x$ (block 200), then $y=Uz$ (block 202).

The above procedure is repeated for the appropriate submatrices at each level in the submatrix hierarchy (blocks 194–204). When the vector has been multiplied by all the submatrices, the resulting interim solution to the matrix is processed to determine whether it is within the tolerance specified by the designer (block 206). If the interim solution is not within the specified tolerance, the method generates another estimated solution vector and the procedures associated with blocks 192–206 are repeated, as necessary. The details of conventional iterative matrix solving techniques are well known in the linear systems art. Accordingly, these details will not be discussed further.

The solution of the matrix represents the current in each of the filaments 42 defined for the inductor of FIGS. 5 and 6. The equivalent inductance $L_{equ}$ and resistance $R_{equ}$ are extracted from these currents:

$$R_{equ}=Re\Sigma_i V_i L_{equ}=Im\Sigma_i V_i, \qquad \text{EQUATION 17}$$

where $$V=(R+j\omega M)I.$$

Given the current distribution, it is relatively easy to obtain other important characterizations of the inductor such as edge effects and the Q factor. In addition, circuit designers may be interested in the solution of the matrix to calculate the behavior of the inductor over a range of frequencies.

From the above, it is apparent that a design tool utilizing the method disclosed herein enables the improved extracting of parameters from a model of a physical system. In practice, the processing cost associated with preprocessing the matrix is approximately equal to the processing cost of about four or five dense matrix-vector products. Hence, it is advantageous to use the method in an iterative scheme when more than five matrix-vector products are employed. When multiple right-hand sides are used (as in a frequency sweep), the preprocessing cost is negligible. In the case of a frequency sweep, the preprocessing stage discussed above needs to be performed only once because only the frequency varies over the sweep. R and M remain fixed. Thus, the cost of the preprocessing is amortized over the frequency sweep.

The processing time for the method grows slightly faster than linearly with respect to the problem size. This compares favorably with the quadratic increase in the processing time of the direct GMRES iteration and the cubic increase in the processing time for Gaussian elimination. For problems of the size of approximately 1000, improved performance of two orders of magnitude over Gaussian elimination and one order of magnitude over GMRES iteration using direct matrix-vector products may be achieved.

More over, unlike the kernel-specific multi-pole accelerated algorithms, this method is readily applicable to arbitrary kernels that arise from Method of Moment discretization, without sacrificing speed or accuracy. For example, EQUATION 18 describes a Green's function that may be used to model a passive element imbedded on a multi-layer substrate. This function involves a complicated series of cosines that cannot be easily solved $$G = \sum_{m,n=0}^{\infty} f_{mn}C_{mn}\cos(\delta x)\cos(\delta x')\cos(\zeta y)\cos(\zeta y') \qquad \text{EQUATION 18}$$

In general, design tools using the method disclosed herein may be employed for a ny physical system i nvolving a force that decays with distance. For example, such a design tool may be used to extract parameters associated with the effect of electromotive forces on components in electrical systems. This includes extracting the capacitance or inductance of interconnections or ground planes in radio frequency applications and digital circuits. This method also may be used in the design of embedded passive components as discussed above. The method may b e used to calculate fluid densities and forces in a fluid-based system or potentials in an electro-static system. The only restriction imposed by the method is that the matrices be locally "smooth." That is, the underlying function should not be discontinuous.

Figure 9:
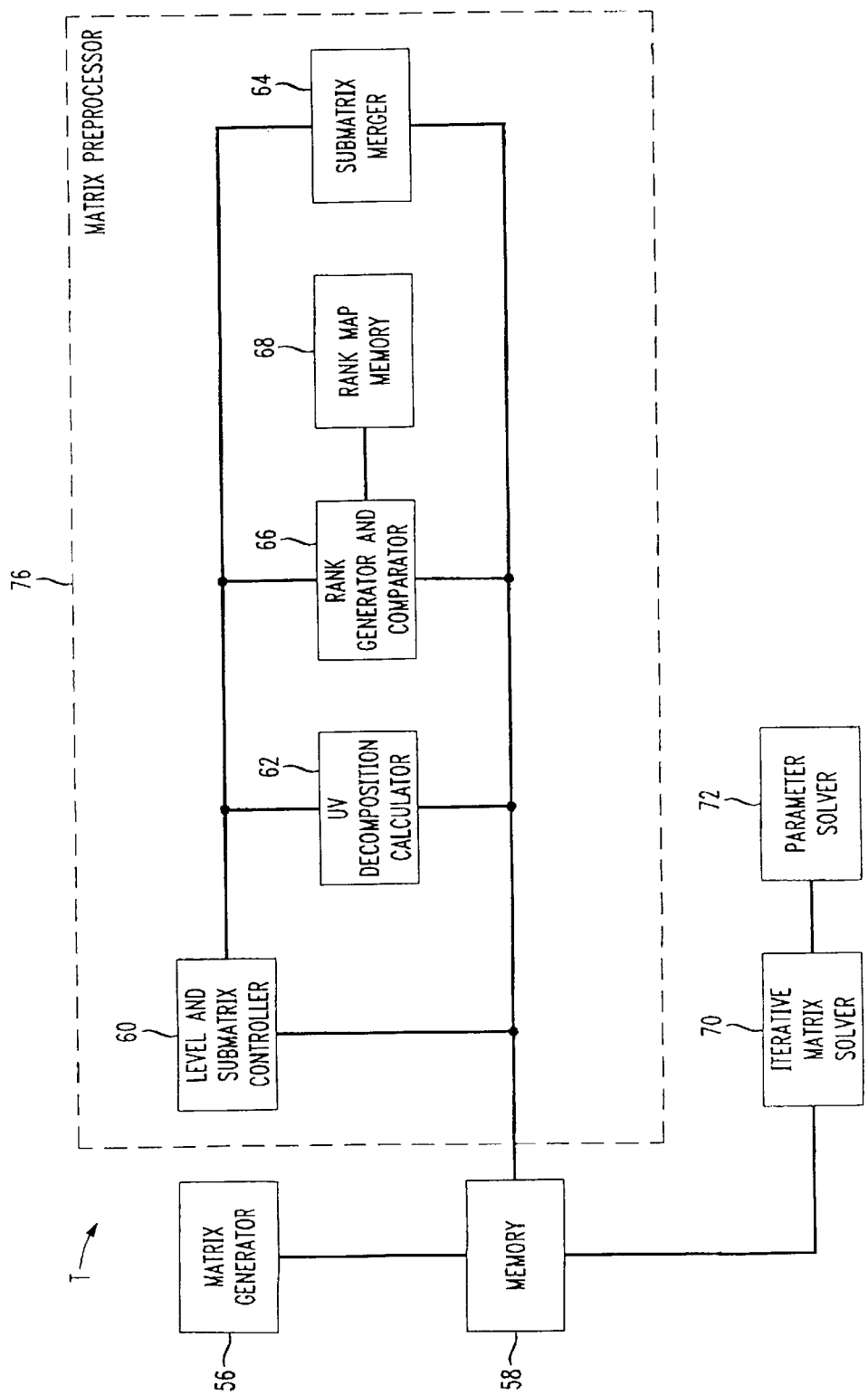
FIG. 9 is a block diagram of one illustrative embodiment of a design tool incorporating a matrix preprocessor constructed according to our invention.

A design tool T which implements the methods discussed above, in accordance with our invention, is illustrated in FIG. 9. Typically, the design tool T would consist of a computing device such as a computer workstation, a mainframe computer or a personal computer, either separate from or part of a CAD processor. The design tool T is attached to a CAD system 55 in which the designer lays out the desired structure and equivalent circuit as in FIG. 5A, 5B and 6. The tool T includes a matrix generator 56 that generates the matrix equations based on the layout and the schematics, and stores them in a memory device 58. The operations of the matrix generator typically include some of those discussed above in conjunction with FIG. 4A.

A level and submatrix controller 60 coordinates the matrix preprocessing procedure. A UV decomposition calculator 62 generates the UV decompositions of the submatrices as discussed above in conjunction with FIG. 4B. A submatrix merger 64 combines the submatrices as discussed above in conjunction with FIG. 4B. A rank generator and comparator 66 calculates the rank of the submatrices, if necessary, and compares the ranks of the parent submatrices with the ranks of their child submatrices to determine which UV decompositions will be used to solve the matrix. If a rank map of the system is available, this may be stored in a rank map memory 68. Alternatively, the rank map may be stored in the memory 58. The design tool T stores the compressed matrix in the memory 58 as it is created.

After the preprocessing step has been completed, an iterative solver 70 calculates the solution of the matrix as discussed above in conjunction with FIG. 8. Finally, a parameter solver 72 calculates the desired parameter using the solution of the matrix as discussed above. The result from solver 72 is returned to the CAD system 55 where the user manipulates the layout on the basis of the result to achieve the desired characteristics.

Figure 10:
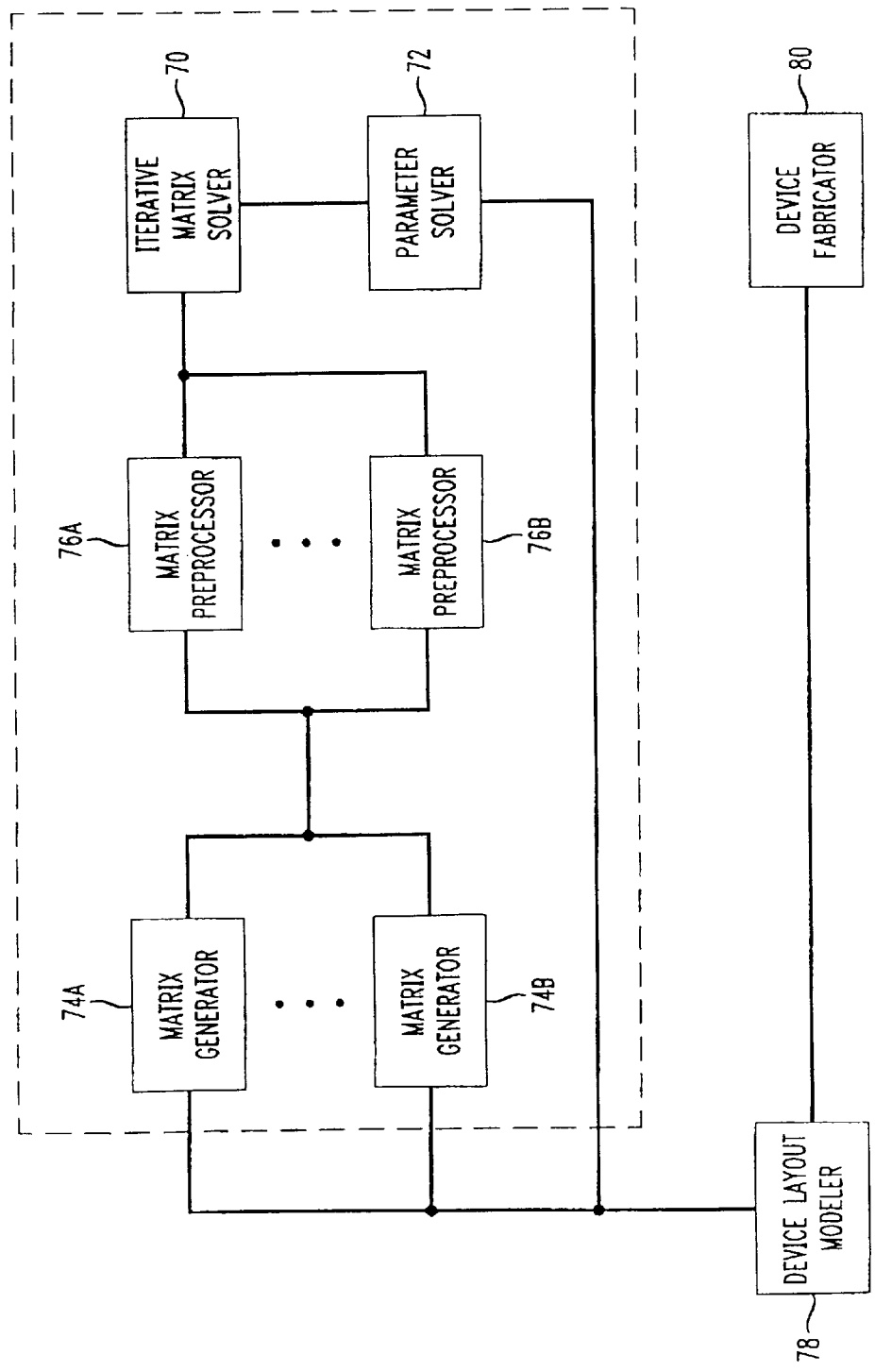
FIG. 10 is a block diagram of another illustrative embodiment of a design tool incorporating parallel matrix generators and matrix preprocessors constructed according our invention.

As shown in FIG. 10, parallel processing may be used in the matrix generator and matrix preprocessing components. For example, the parallel components could be configured to processes a subset of the submatrices. In this configuration, matrix generators 74A and 74B produce separate portions of the matrix concurrently. Similarly, matrix preprocessors 76A and 76B compress different portions of the matrix concurrently.

FIG. 10 also describes other parts of the design system. A device layout modeler 78, which is part of or similar to the CAD 55 of FIG. 9, is used to design the physical model of the component. A device fabricator 80 is used to generate the multi-chip module or integrated circuit from the design developed using the design tool, thus resulting in an improved CAD/CAM system according to our invention.

While certain specific embodiments of the invention are disclosed as typical, the invention is not limited to these particular forms, but rather is applicable broadly to all such variations as fall within the scope of the appended claims. To those skilled in the art to which the invention pertains, many modifications and adaptations will occur. For example, the design tool may be implemented using a variety of hardware configurations. General purpose computing devices or customized hardware may be used depending on cost and performance requirements. In addition, various matrix generation techniques, submatrix compression techniques, submatrix blending techniques and matrix solving techniques may be used in practicing the claimed invention. Thus, the specific structures and methods discussed in detail above are merely illustrative of a few specific embodiments of the invention.

What is claimed is:

1. A design tool for designing a physical system by extracting a parameter of a modeled component of the system, said tool comprising:
   a matrix generator for producing signals indicative of a system of equations representative of the operation in the system of a plurality of segments defining said component, said system of equations forming a matrix of signals;
   a memory for storing said matrix;
   a submatrix controller for acting on said memory to subdivide said matrix into a hierarchy of submatrices, said hierarchy defining at least one parent submatrix and a plurality of child submatrices each with a rank;
   a UV decomposition generator for compressing at least one of said child submatrices;
   a submatrix merger for combining a plurality of said child submatrices to produce a merged submatrix;
   a rank comparator for selecting either said merged submatrix or a plurality of said child submatrices based on their relative rank;
   an iterative matrix solver for producing a signal representing solution of said matrix using said selected submatrix or submatrices; and
   a parameter solver for processing said solution signal to generate a signal representative of said parameter and using it to define the structure of the component in the system.

2. A design tool according to claim 1 wherein said UV decomposition generator uses a pivoted Graham-Schmidt algorithm.

3. A design tool according to claim 1 wherein said rank comparator compares a rank of said parent submatrix with a plurality of ranks of said child submatrices using the following equation:

$$r < \frac{1}{2}(r_1 + r_2 + r_3 + r_4)$$

where r is said rank of said parent submatrix and $r_1, r_2, r_3$ and $r_4$ are said ranks of said child submatrices.

4. A design tool according to claim 1 wherein said submatrix merger merges a pair of said child submatrices using a pivoted Graham-Schmidt algorithm.

5. A design tool according to claim 1 wherein said matrix generator produces said system of equations using a Method of Moments algorithm.

6. A design tool according to claim 1 wherein said iterative matrix solver uses a Krylov subspace iterative algorithm.

7. A design tool according to claim 1 wherein said parameter is associated with an interaction of said component with a force defined in the model and acting upon said component.

8. A design tool according to claim 7 wherein said parameter is an inductance and said force is an electromotive force.

9. A design tool according to claim 7 wherein said parameter is a capacitance and said force is an electromotive force.

10. A design tool according to claim 1 further comprising a component modeler for generating said modeled component.

11. A design tool according to claim 1 further comprising a plurality of matrix generators adapted to concurrently produce said matrix.

12. A design tool according to claim 1 further comprising a plurality of matrix preprocessors adapted to concurrently compress said matrix, said matrix preprocessors including at least one of said UV decomposition generator, said submatrix merger or said rank comparator.

13. In a computer-aided design system, a method for determining a physical property of an object under design, said method including the steps of:
   defining a plurality of segments of said object;
   generating signals indicative of a system of equations representative of the operation of said segments, said signal indicative of the system of equations being stored in memory as a matrix;
   subdividing said memory matrix into a hierarchy of submatrices, said hierarchy defining at least one parent submatrix and a plurality of child submatrices each with a rank;
   compressing the stored signals of at least one of said child submatrices to form a compressed child submatrix;
   merging a plurality of the stored signals of said child submatrices to provide a merged submatrix;
   selecting either said merged submatrix or a plurality of said child submatrices depending on their rank;
   generating a signal representing solution of said matrix using said selected submatrix or submatrices to determine a physical property associated with said object; and
   using said property in the computer-aided design system to design the structure of said object.

14. A method according to claim 13 wherein said compressing step further includes the step of calculating a UV decomposition of said at least one submatrices.

15. A method according to claim 13 wherein said step of calculating a UV decomposition uses a pivoted Graham-Schmidt algorithm.

16. A method according to claim 13 wherein said selecting step further includes the step of comparing a rank of said parent submatrix with a plurality of ranks of said child submatrices.

17. A method according to claim 16 wherein said step of comparing said ranks uses the following equation:

$$r < \frac{1}{2}(r_1 + r_2 + r_3 + r_4)$$

where r is said rank of said parent submatrix and $r_1, r_2, r_3$ and $r_4$ are said ranks of said child submatrices.

18. A method according to claim 13 wherein said merging step further includes the step of merging a pair of said child submatrices using a pivoted Graham-Schmidt algorithm.

19. A method according to claim 13 wherein said step of generating a system of equations comprises using a Method of Moments algorithm.

20. A method according to claim 13 wherein said step of generating a solution comprises an iterative matrix solving algorithm.

21. A method according to claim 20 wherein said iterative matrix solving algorithm is a Krylov subspace iterative algorithm.

22. A method according to claim 13 wherein said physical property is associated with an interaction of an object with a force acting on said object.

23. A method according to claim 22 wherein said physical property is an inductance and said force is an electromotive force.

24. A method according to claim 22 wherein said physical property is a capacitance and said force is an electromotive force.

25. A method according to claim 13 further including the step of generating a physical model of said object.

26. A method of operating a design tool to solve a matrix representative of a parameter associated with an interaction of an object with a force acting on said object, said method including the steps of:

storing in a memory signals representative of said matrix;

subdividing said matrix memory into a hierarchy of submatrices, said hierarchy defining at least one parent submatrix and a plurality of child submatrices;

compressing the signals of at least one of said child submatrices by calculating a UV decomposition of said at least one child submatrices;

merging the signals of a plurality of said child submatrices to provide merged submatrix signals;

selecting either said merged submatrix signals or a plurality of said child submatrices signals; and generating a solution of said matrix using said selected submatrix or submatrices.

27. A method according to claim 26 wherein said compressing step uses a pivoted Graham-Schmidt algorithm.

28. A method according to claim 26 wherein said selecting step further includes the step of comparing a rank of said parent submatrix with a plurality of ranks of said child submatrices using the following equation:

$$r < \frac{1}{2}(r_1 + r_2 + r_3 + r_4)$$

where r is said rank of said parent submatrix and $r_1, r_2, r_3$ and $r_4$ are said ranks of said child submatrices.

29. A method according to claim 26 wherein said merging step further includes the step of merging a pair of said child submatrices using a pivoted Graham-Schmidt algorithm.

30. A method according to claim 26 wherein said matrix is generated using a Method of Moments algorithm.

31. A method according to claim 26 wherein said generating a solution step further includes using a Krylov subspace iterative algorithm.

* * * * *